United States Patent [19]
Fastnacht et al.

[11] Patent Number: 5,698,496
[45] Date of Patent: Dec. 16, 1997

[54] METHOD FOR MAKING AN ANISOTROPICALLY CONDUCTIVE COMPOSITE MEDIUM

[75] Inventors: Richard Alan Fastnacht, New Providence; Sungho Jin, Millington; Wei Zhu, North Plainfield, all of N.J.

[73] Assignee: Lucent Technologies Inc., Murray Hill, N.J.

[21] Appl. No.: 387,142

[22] Filed: Feb. 10, 1995

[51] Int. Cl.$^6$ ............................. B05D 5/12; B05D 3/02
[52] U.S. Cl. ..................... 505/470; 505/739; 427/226; 427/230; 427/62; 427/294
[58] Field of Search ............................. 505/452, 470, 505/739, 450; 427/62, 294, 230, 226

[56] References Cited

U.S. PATENT DOCUMENTS

| | | | |
|---|---|---|---|
| 4,737,112 | 4/1988 | Jin et al. | 439/66 |
| 5,045,249 | 9/1991 | Jin et al. | 264/24 |

OTHER PUBLICATIONS

Komatsu et al, Jpn. J. Appl. Phys. vol. 27, No. 4, Apr. 1988, pp. L533–535.
C.A. Huber et al., "Narrow Array Composites", *Science* vol. 263, p. 800 (1994).
M.J. Tierney et al. "Transparent Metal Microstructures", *J. Phys. Chem.*, vol. 93, p. 2878 (1989).
R.C. Furneaux et al., "The formation of controlled-porosity membranes from anodically oxidized aluminum", *Nature*, vol. 337, p. 147 (1989).
R.J. Tonucci, et al. "Nanochannel Array Glass", *Science*, vol. 258, p. 783 (1992).

*Primary Examiner*—Roy V. King
*Attorney, Agent, or Firm*—Glen E. Books; Patricia A. Verlangieri

[57] ABSTRACT

In accordance with the invention, a high density z-direction interconnection medium is made by the steps of providing a non-conductive membrane having z-direction channels, filling the channels with liquid precursor of conductive material, converting the trapped precursor into conductive material within the channels, and, advantageously, forming solder bumps in contact with the conductive material in the channels. The method is particularly useful for forming hollow tubular or porous conductive pathways having enhanced resistance to thermal and mechanical stress. The channels can be conveniently filled by vacuum suction.

8 Claims, 3 Drawing Sheets

METHOD FOR MAKING AN ANISOTROPICALLY CONDUCTIVE COMPOSITE MEDIUM

FIELD OF THE INVENTION

This invention relates to an anisotropically conductive composite medium, methods for making such a medium and device assemblies interconnected thereby.

BACKGROUND OF THE INVENTION

All modern electronic products including computers, consumer electronics, telecommunication equipment and automobile electronics require circuit interconnection and packaging. While there has been a dramatic decrease in circuit feature size to the micron and even sub-micron level over the past several years, the progress in the density of circuit-to-circuit mating interconnection and device packaging has been much slower. The disparity between the micron-level features of silicon devices and the hundreds-of-microns required for interconnection contact pads has forced very inefficient device integration. Much device real estate is wasted on fan-outs to larger soldering contact pads. Such fan-outs produce longer travel paths for electronic signals and hence slower device speed than could be realized with a compact, high-density interconnection scheme.

High or ultra-high density interconnection of mating contacts can be obtained if a fine-scale, direction anisotropically conductive medium with x-y electrical isolation is available. Z-direction anisotropically conductive media are described in U.S. Pat. Nos. 5,045,249 and 4,737,112 issued to S. Jin et al., and in Jin et al. co-pending U.S. patent applications Ser. Nos. 08/251,548, filed May 31, 1994, now abandoned, 08/251,547, filed May 31, 1994, now U.S. Pat. No. 5,591,037, and 08/255,687, filed Jun. 8, 1994, now U.S. Pat. No. 5,509,815. Submicron-scale anisotropic media are described in "Narrow Array Composites" by C. A. Huber et al, *Science*, Vol. 263, p. 800, 1994, and "Transparent Metal Microstructures" by M. J. Tierney et al., *J. Phys. Chem.*, Vol. 93, p. 2878, 1989. The articles describe processing methods based on either high pressure injection of molten metal or electroplating of metal into microporous materials such as an anodized aluminum oxide membrane. Preparation of base membranes with vertical (z-direction) channels is described in "The Formation of Controlled-Porosity Membrane from Anodically Oxidized Aluminum", by R. C. Furneaux et al., *Nature*, Vol. 337, p. 147, 1989.

High presure injection of molten metal into submicron sized pores is difficult due to the generally high viscosity of molten metals. It requires handling of essentially individual membranes in a high pressure environment. The electroplating of metal in submicron pores with a very high aspect ratio is a time consuming, delicate and expensive process. Moreover, both injection and electroplating generally result in completely filling the vertical pores with metal. Such filled composites are susceptible to stresses, as by the thermal expansion mismatch and thermal conductivity mismatch between the conducting metal column and the matrix material. Accordingly, there is a need for a new method of making a high density z-direction interconnection medium.

SUMMARY OF THE INVENTION

In accordance with the invention, a high density z-direction interconnection medium is made by the steps of providing a non-conductive membrane having z-direction channels, filling the channels with liquid precursor of conductive material, converting the trapped precursor into conductive material within the channels, and, advantageously, forming solder bumps in contact with the conductive material in the channels. The method is particularly useful for forming hollow tubular or porous conductive pathways having enhanced resistance to thermal and mechanical stress. The channels can be conveniently filled by vacuum suction,

BRIEF DESCRIPTION OF THE DRAWINGS

The nature, advantages and various additional features of the invention will appear more fully upon consideration of the illustrative embodiments now to be described in detail in the accompanying drawings. In the drawings.

It is to be understood that the drawings are to illustrate the concepts of the invention and are not to scale.

DETAILED DESCRIPTION

Figure 1:
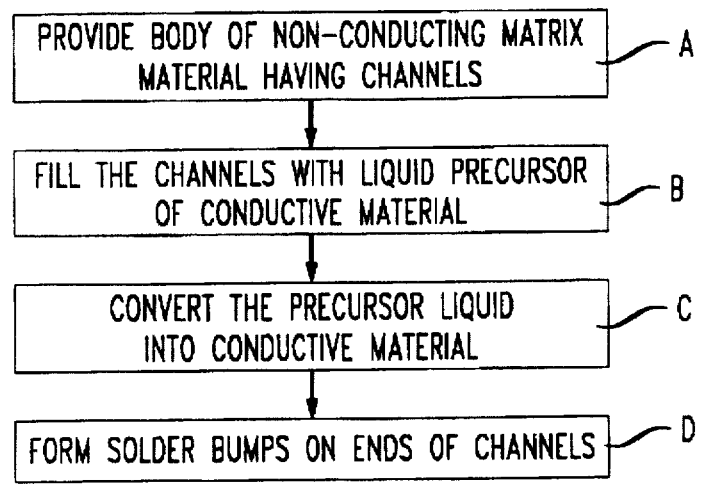
FIG. 1 is a block diagram showing the steps of making a high-density, anisotropically conductive composite medium.

Referring to the drawings, FIG. 1 is a block diagram showing the steps in creating a high-density, z-direction anisotropically conductive composite medium. The first step (block A in FIG. 1) is to provide a body of electrically non-conductive matrix material, preferably in the form of thin membrane, sheet or plate having a pair of major surfaces, which contains vertical or near-vertical channels between the major surfaces (i.e. the channels are perpendicular or nearly perpendicular to the major surfaces. This perpendicular direction is referred to as the z-direction). An example is a commercially available $Al_2O_3$ membrane, Anopore, manufactured and sold by Whatman Laboratory, Inc. The preparation of such material is described by R. C. Furneaux et al., *Nature*, Vol. 337, p. 147 (1989). An alternative matrix material can be made by co-drawing bundled glass rods containing etchable cores. See Tonucci et al., *Science*, Vol. 258, p. 783 (1992). Submicron-sized parallel holes, as fine as about 1000 Å in diameter, are relatively easily obtained. In addition to these ceramic materials, the matrix can be made of polymeric materials such as plastics. For example, suitable polycarbonate-based PCTE filter membranes are manufactured by Poretics Corp.

The desired diameter of the vertical channels useful in this invention is in the range of 100–100,000 Å, and preferably in the range of 200–5000 Å. The desired thickness of the matrix medium is in the range of 1–1000 µm, and preferably in the range of 10–100 µm. The channels in the membrane do not have to be exactly vertical. Somewhat inclined angles are acceptable, however, the channels preferably make an angle of more than 45° with the major surfaces. The channels should not be connected to each other in order to permit high interconnection density. The inclined channels can be parallel to each other or can be randomly oriented.

The next step shown in FIG. 1 (block B), is to fill the channels with a liquid precursor of conductive material. The precursor can be an aqueous solution, an organic solvent solution, a colloidal suspension, a metallorganic precursor, or a molten salt. The precursor should contain ions, such as metal ions, or compounds for eventual conversion into conductive metals (such as Cu, Ag, Au, Pt, Ni, Sn, Pb) or conductive compounds. The precursor can also convert into mixture of metals such as 63% Sn -37% Pb solder composition. Instead of containing metals, the precursor liquid can contain precursors for nonmetallic conductors such as carbon (e.g., $C_2H_5OH$ or $CCl_4$), oxide conductor such as $La_{0.67}Ca_{0.33}MnO_x$, or superconductors such as $YBa_2Cu_3O_{7-x}$.

The viscosity of the precursor liquid is preferably relatively low so that it can be easily vacuum sucked into the submicron-sized channels of the membrane. Exemplary precursor liquids include aqueous solutions of $CuSO_4$ or $AgNO_3$, or $YBa_2Cu_3O_{7-x}$. While the non-metallic conductors such as oxides or nitrides are generally stable in ambient atmosphere, some metals or alloys tend to be easily oxidized if they have submicron dimensions. In such a case, noble metals such as Ag, Au, Pd are generally preferred.

The preferred method for filling channels in the membrane is to use low-intensity vacuum suction commonly available in industrial laboratories and manufacturing plants. Aqueous solution precursors are easily vacuum suctioned into the small channels. The Anopore material (e.g., alumina membrane with ~2000 Å dia. vertical holes, ~50 μm height) can be filled with aqueous solution precursors using a vacuum of 0.1–0.5 atmospheres.

Figure 2:
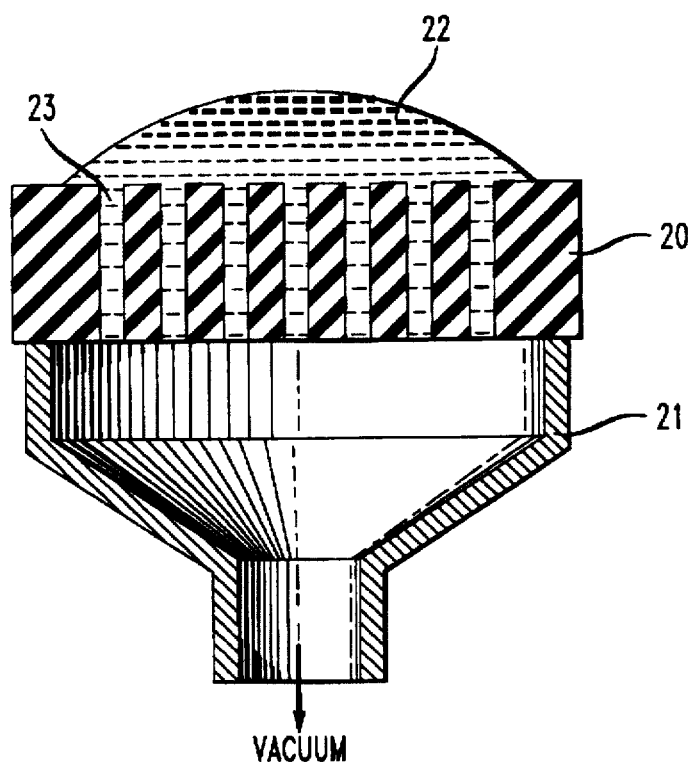
FIG. 2 schematically illustrates an exemplary step of filling the vertical channels with a liquid precursor of conductive material.

FIG. 2 schematically illustrates the preferred filling step. One major surface of matrix membrane 20 is subjected to a vacuum as by placing the membrane across a suction head 21. The other surface is placed in contact with the precursor liquid 22, filling the channels 23. After the channels are filled, the excess liquid above and below the membrane can be gently wiped, washed or blown off. The liquid inside the channels is maintained by capillary force. Any left-over metal (or conductor) on the top and bottom surfaces of the membrane after the final heat treatment can be removed by gentle chemical etching or physical means such as polishing, sputter etching or plasma etching.

The third step in FIG. 1 (block C) is to convert the precursor liquid into conductive material. This can be accomplished by applying heat to dry the precursor liquid trapped in the channels and to decompose it into conductor. In order to obtain a metallic conductor in the channels, the heat treatment is preferably carried out in a vacuum or hydrogen-containing atmosphere such as pure $H_2$ gas, forming gas (e.g., 2–10% $H_2$ in $N_2$ or Ar gas) or $NH_3$ gas. The required temperature and time to reduce oxides or compounds into elemental metals varies widely depending on the stability and thermodynamic parameters. To obtain Cu from $CuSO_4$ or CuO, a heat treatment in hydrogen at ~350° C. or higher for 10 min.–10 hrs. is required. Ni, Co, Fe and Sn require higher reduction temperatures. If a carbon or graphitic conductor is to be created, the carbon-containing precursor can be subjected to heat treatment in an inert or oxygen-containing atmosphere. If metal-oxide or metal-nitride conductors are to be created, the precursors may need to be heat treated in an oxygen-containing or nitrogen-containing atmosphere with specific oxygen or nitrogen partial pressure. Noble metals (such as Au, Ag, Pt) in the channels are generally more easily obtained from their precursors using vacuum, or atmospheres of inert gas, hydrogen, nitrogen, or oxygen. The processing steps B and C in FIG. 1 can be repeated more than once depending on the amount and configuration of the conductor material in the channels.

Because of the temperatures of decomposition heat treatment (typically higher than about 300° C. in a hydrogen-containing reducing atmosphere), alumina or glass matrix materials are preferred as compared to polymer or organic matrix materials. The heat treatment temperature and time can be advantageously reduced if a hydrogen-containing plasma is used, because of the easier reduction of metal oxides into metals in a hydrogen plasma environment. Reduced exposure to high temperature minimizes potential damage to the matrix material, such as warpage or decomposition.

Preferably the liquid precursor and processing conditions are chosen to provide hollow tubular conductive pathways or porous conductive pathways through the channels. Hollow, tube-shaped conductive pathways are created by using a relatively dilute precursor solution, so that after drying and decomposition, there is only enough reduced conductor left to coat the channel walls. For example, if an aqueous solution consisting of 8:1 weight ratio of $AgNO_3$ and hot water (which is equivalent to a $Ag:H_2O$ weight ratio of about 5:1 or a volume ratio of about 1:2) is used to fill up a channel of 2000 Å dia.×50 μm height, the eventual Ag coating on the wall of the channels would be ~180 Å thick.

Figure 3:
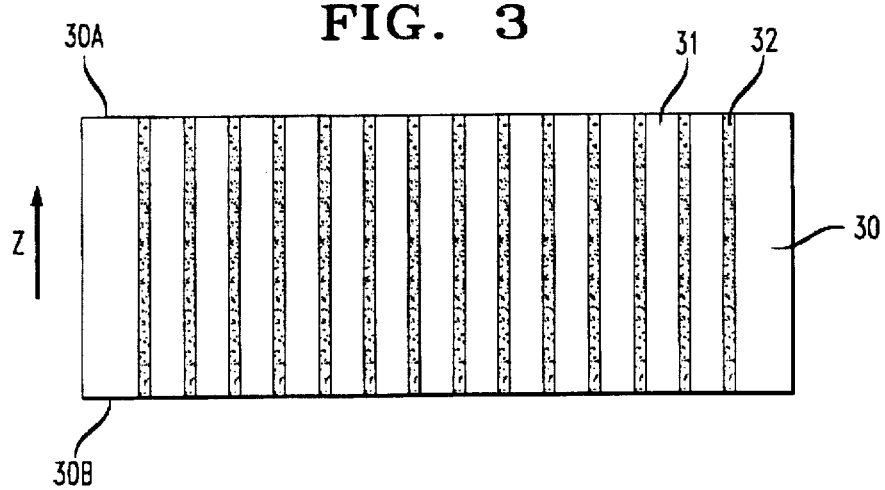
FIG. 3 is a schematic cross-sectional view of one embodiment of an anisotropically conductive composite made by the process of FIG. 1.

FIG. 3 illustrates a matrix membrane 30 having a plurality of channels 31 with hollow, tubular conductive pathways 32 through the channels. Because of the geometry, the electrical conduction is anisotropic along the z-direction between the major surfaces 30A and 30B.

The tube-shaped conductor configuration of FIG. 3 is particularly advantageous for z-direction circuit interconnection applications. Firstly, it exhibits enhanced resistance to thermal and mechanical stress. The difference in thermal expansion coefficient α between the conductor (usually a metal) in the channel and the matrix membrane (usually an insulator such as ceramics or polymers) are often substantial. For example, $\alpha(Ag)\sim 19.7\times 10^{-6}$, $\alpha(Al_2O_3)\sim 6.8\times 10^{-6}$, and $\alpha$ (polycarbonate)~$67.5\times 10^{-6}$. If the channels in $Al_2O_3$ or polycarbonate membranes are completely filled up with metals, e.g., by high-pressure injection of molten metal or by electroplating, the resultant composite is susceptible to severe stresses caused by the thermal expansion mismatch or volume change in solidification either during the composite fabrication or during the device transport or service. Computer device interconnections, for example, are exposed to temperature variations between –40° C. and +100° C. Such stresses could cause microcracks, breaks or warpage either in the ceramic or polymer matrix or microcracks and electrical discontinuity in the vertical conductor (especially if it is a mechanically brittle compound such as oxide-based or nitride-based materials). Because of the hollow space in the tube-shaped conductor of FIG. 3, however, the expansion mismatch is more easily accommodated and such mechanical failures are minimized. Secondly, the hollow space can advantageously be utilized to lock in a solder joint material that is useful for connections onto the two mating devices.

The process of tube formation can be repeated if thicker metal deposition and improved conductivity are needed, or in the event that a solid rod-shape conductor configuration is desired. It is important that a saturated or near-saturated solution be used for the second time (or additional repetition) vacuum suction processing so as not to partially or wholly dissolve off the previously deposited metal or precursor cylinder.

Another advantageous approach is to choose the precursor and processing conditions to produce porous conductive pathways in the channels. Instead of aqueous or solvent-based solutions, molten liquids of metal-containing salt especially with low melting points, such as $SnCl_4$ (m.p.=–33° C.), $AgNO_3$ (m.p.=212° C.), or Cu $(CH_3COO)_2$ (m.p.= 115° C.) may be vacuum suctioned into the channels (optionally preheated) followed by decomposition heat treatment to obtain the metallic state. Because of the generally higher viscosity in the molten salts than in the aqueous solutions, the processing is more difficult than in the case of aqueous solutions. Somewhat stronger vacuum suction power is required for the molten salts. Therefore, a preferred method according to the invention is to combine the aqueous solution approach and the molten salt approach. The walls of the channels are first coated with either undecomposed, partially decomposed or fully decomposed precursor material (e.g., $AgNO_3$ or Ag), which enhances wetting of the molten salt in the subsequent processing for easier vacuum suction into the channels.

Figure 4:
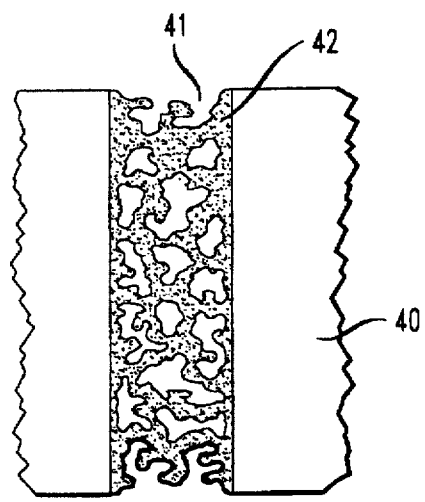
FIG. 4 is a schematic cross-sectional view of a second embodiment of anisotropically conductive composite.

After the decomposition heat treatment of the molten salt, preferably in a reducing atmosphere, the resultant metal in the channels takes a porous configuration forming a network of conductor. The porous conductive structure contains internal spaces. Hence it easily accommodates thermal expansion mismatch and associated mechanical stresses. Furthermore, solder bump materials can easily be added and locked into the top and bottom ends of the porous metal in the channels for improved adhesion. FIG. 4 illustrates the resulting structure showing a membrane 40 wherein channels 41 are filled with porous conductor 42.

The next step, which is optional, is to apply solder bumps to lock in the conductive material and facilitate contact with the channel pathways. The solder bumps can be made from eutectic Pb-63Sn, Bi-Sn, Au-Sn, In, or any suitable low-melting point solder metal or alloy (preferably mechanically soft). They can be added onto the top and bottom part of the channel using known processing methods, such as dip coating, electroless deposition, or electrolytic plating.

Figure 5A:
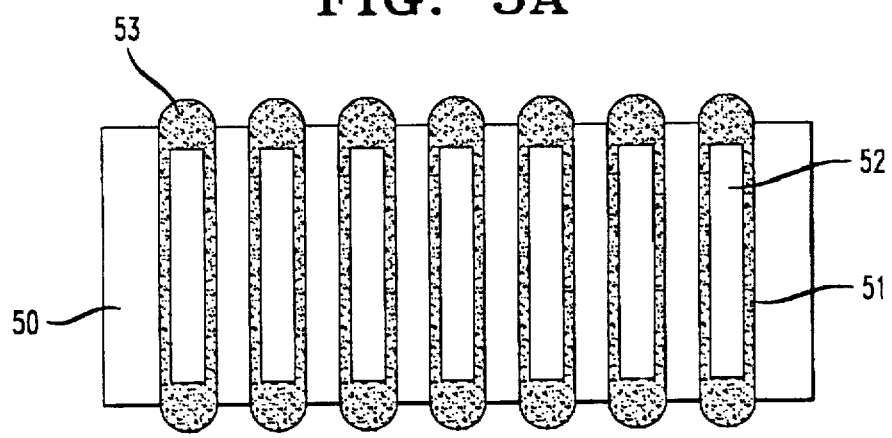
FIGS. 5A and 5B illustrate the composites of FIGS. 3 and 4 with solder bumps locked into the conductive pathways.
Figure 5B:
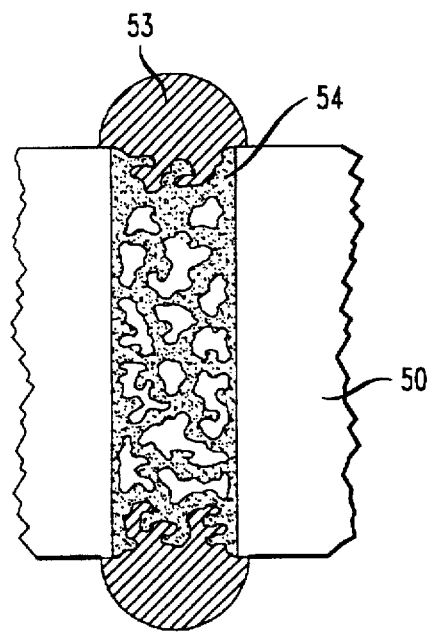

The resulting structures are shown in FIG. 5A and FIG. 5B. In FIG. 5A, membrane 50 has hollow tubular conductors 51 in channels 52. Solder bumps 53 lock the conductors in the channels. In FIG. 5B, the structure has porous conductors 54 in the channels. The solder bumps 53 lock to irregularities in the porous network.

Methods for preparing the conductive media can be understood by considering the following examples.

EXAMPLE 1

Vertical channels in aluminum oxide membranes (Anopore from Whatman Laboratory, Inc.) with a dimension of 2.5 cm dia., 50 µm thick, with about 50% of the volume consisting of ~2000 Å dia. vertical channels were filled with a saturated $AgNO_3$ solution in water by using vacuum suction. The excess liquid on the faces of the membrane was wiped off. The membranes were then slowly heated in an hydrogen atmosphere in 1 hr. to 400° C., held for 1 hr., and furnace cooled. The processed membranes became anisotropically vertically conductive with the electrical resistance through the membrane thickness measured to be ~0.6 Ω over the contact pad dimension of about 0.1×0.1 cm. The in-plane electrical resistance of the processed membrane sample over the distance of about 0.5 cm was greater than the maximum measurement capability of the multimeter used, i.e., $>2\times10^8$ Ω. Energy dispersive x-ray analysis from the fractured cross-section of the membrane showed a strong Ag peak indicating the presence of Ag in the channels. Top view microstructure by Scanning Electron Microscopy analysis shows hollow channels indicating that Ag deposition is primarily on the wall of the channels.

EXAMPLE 2

A saturated aqueous solution of $In(NO_3)_3$ was vacuum suctioned into the channels of Anopore and was given a decomposition heat treatment in $H_2$ at 600° C./2 h. The processed membrane was anisotropically conductive, and exhibited a vertical electrical resistance of ~200 KΩ and no measurable electrical conduction in the in-plane direction.

Figure 6:
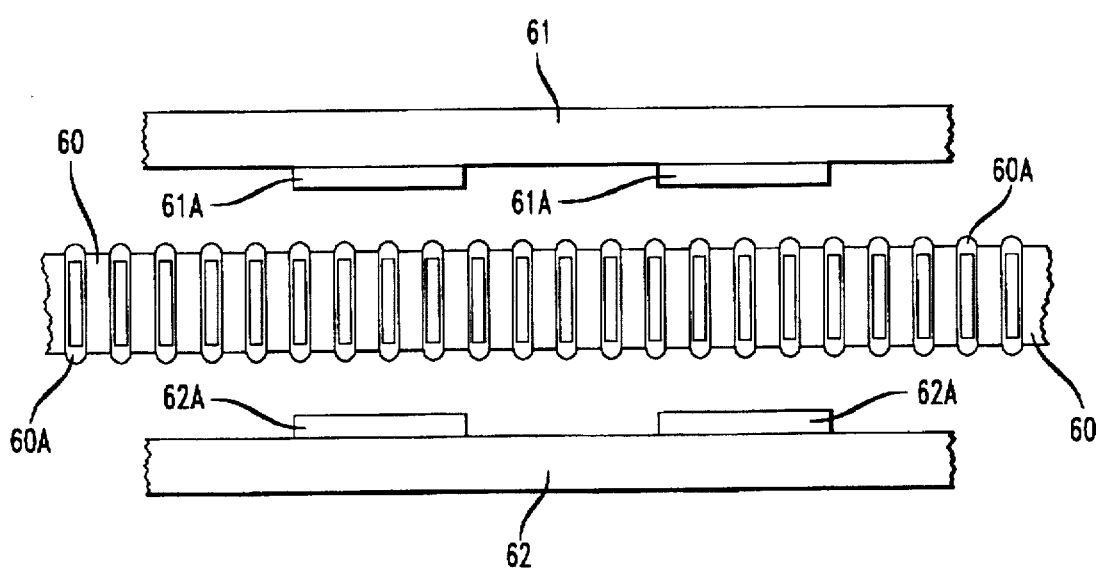
FIG. 6 is an exemplary embodiment of high-density mating interconnection of circuit devices using the inventive anisotropically conductive composite medium.

The anisotropically conductive medium, prepared in accordance with the invention, is particularly useful for ultra-high-density interconnection of mating circuits. It can be used to interconnect silicon substrates, ceramic substrates such as alumina, and printed circuit boards. An exemplary embodiment is shown in FIG. 6. The anisotropically conductive medium 60 having solder bumps 60A is placed between two mating circuits 61 and 62 having contact pads 61A and 62A. Each contact pad on the circuit boards, which may optionally be coated with solder material, is facing a multitude of the vertically oriented conductive channels (and associated solder bumps 60A). The sandwich assembly of FIG. 6 is pressed and heated to melt the solder and obtain vertical interconnections. For a channel configuration of 2000 Å diameter with 2000 Å inter-channel spacing in the medium, each contact pad of 1 µm×1 µm area would have an adequate number (about six) of the parallel, vertical connections. Considering the typical contact pad size of 100×100 µm on the present-day Si substrates and 500×500 µm on printed circuit boards, the 1×1 µm pad interconnection made possible by the anisotropically conductive medium would have four orders of magnitude or greater improved areal density of circuit connections.

While specific embodiments of the present invention are shown and described in this application, this invention is not limited to these particular forms. The invention also applies to further modifications and improvements that do not depart from the spirit and scope of this invention.

We claim:

1. A method for making an anisotropically conductive medium comprising the steps of:

providing a body of non-conducting matrix material having a pair of major surfaces and a plurality of channels extending between said surfaces, said channels having diameters in the range 100 to 100,000 angstroms;

filling said channels with a liquid precursor of conductive material; and converting said liquid precursor into conductive material forming conductive paths through said channels, wherein said liquid precursor is converted by evaporating said liquid and heating the dried precursor to decomposition.

2. The method of claim 1 wherein said channels are filled by vacuum suction.

3. The method of claim 1 including the further step of forming solder bumps on the ends of said channels in contact with said conductive paths.

4. The method of claim 1 or claim 3 wherein said liquid precursor is converted into conductive material forming hollow, tubular conductive paths.

5. The method of claim 1 or claim 3 wherein said liquid precursor is converted into porous conductive material.

6. The method of claim 1 or claim 3 wherein said liquid precursor comprises an aqueous solution including metal ions.

7. The method of claim 1 or claim 3 wherein said liquid precursor comprises a precursor for high temperature superconductor.

8. The method of claim 1 or claim 3 wherein said liquid precursor comprises a molten salt.

\* \* \* \* \*